US006560552B2

(12) United States Patent
Shen et al.

(10) Patent No.: US 6,560,552 B2
(45) Date of Patent: May 6, 2003

(54) DYNAMICALLY CONFIGURABLE PROCESS FOR DIAGNOSING FAULTS IN ROTATING MACHINES

(75) Inventors: Hwa N. Shen, Brookfield, WI (US); Rick A. Verhaalen, Whitefish Bay, WI (US)

(73) Assignee: Johnson Controls Technology Company, Plymouth, MI (US)

( * ) Notice: Subject to any disclaimer, the term of this patent is extended or adjusted under 35 U.S.C. 154(b) by 0 days.

(21) Appl. No.: 09/812,924

(22) Filed: Mar. 20, 2001

(65) Prior Publication Data

US 2002/0138217 A1 Sep. 26, 2002

(51) Int. Cl.[7] .................... G06F 19/00; G01M 7/00
(52) U.S. Cl. .................... 702/56; 702/35; 702/183; 702/185; 73/579; 73/660
(58) Field of Search ................. 702/33, 34, 35, 702/56, 182–183, 185, 189–190; 73/579, 602, 559, 660, 462

(56) References Cited

U.S. PATENT DOCUMENTS

| 5,544,073 | A | * | 8/1996 | Piety et al. ............... 73/660 |
| 5,895,857 | A | | 4/1999 | Robinson et al. .......... 73/660 |
| 5,922,963 | A | * | 7/1999 | Piety et al. ............... 702/183 |
| 6,041,287 | A | * | 3/2000 | Dister et al. ............. 702/182 |
| 6,116,089 | A | | 9/2000 | El-Ibiary .................. 73/593 |
| 6,289,735 | B1 | * | 9/2001 | Dister et al. ............. 73/579 |

* cited by examiner

*Primary Examiner*—Bryan Bui
(74) *Attorney, Agent, or Firm*—Foley & Lardner

(57) ABSTRACT

A technique for detecting problems in a rotating machine is configured by the user specifying components and the functional characteristics of a particular installation of a rotating machine. The machine specification are used to identify salient observations that can be derived from measurement data regarding the machine performance. Rules are specified by the user to deduce machine signatures from the salient observations and detect problems evidenced by the machine signatures.

22 Claims, 2 Drawing Sheets

FIG. 1
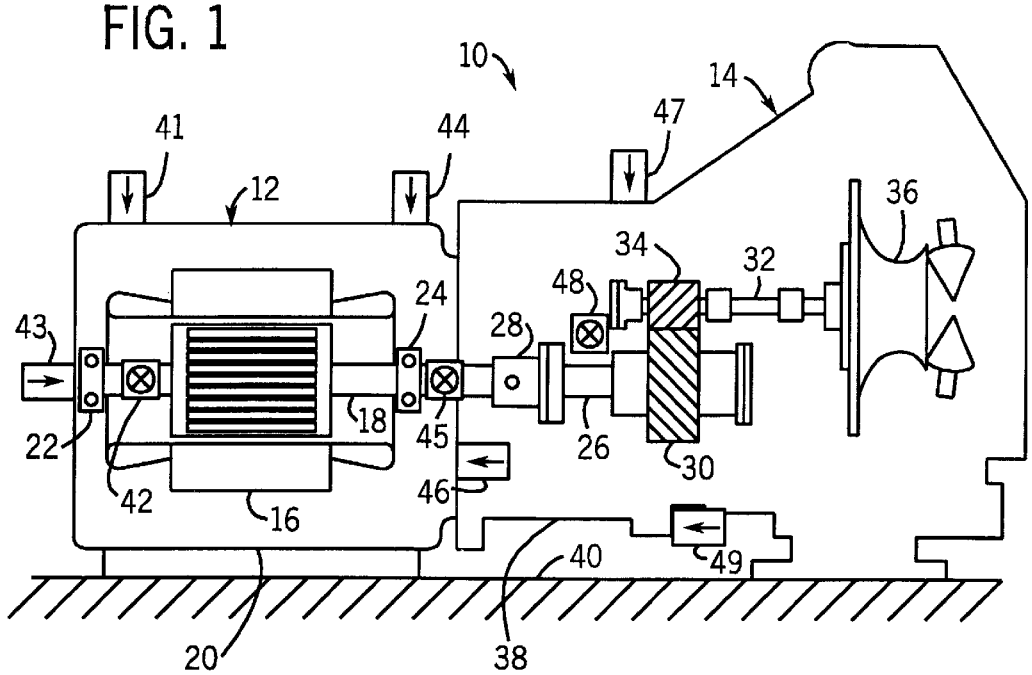
FIG. 2
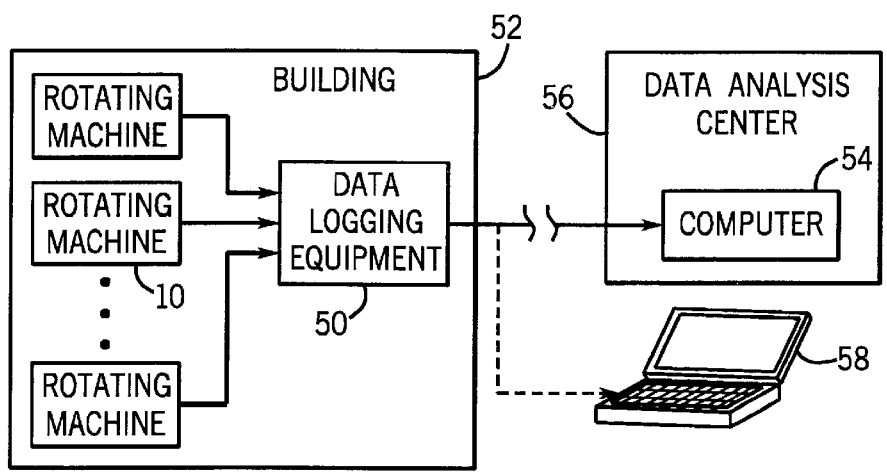
FIG. 3

DYNAMICALLY CONFIGURABLE PROCESS FOR DIAGNOSING FAULTS IN ROTATING MACHINES

BACKGROUND OF THE INVENTION

The present invention relates to apparatus and methods for monitoring the operation of rotating machines, such as compressors and pumps in heating, ventilation and air conditioning systems; and more particularly to apparatus which monitors vibration of such rotating machines.

Rotating machines have a wide variety of applications. For example, motors drive compressors and pumps in heating, ventilation and air conditioning (HVAC) systems found in most buildings. Inevitably such machinery develops various mechanical problems with time. Bearings wear, cracks and other deformations develop, and the rotating components become unbalanced. Initially such faults merely reduce the efficiency and performance of the machine. However, if not remedied in time, the faults can progress in magnitude to a point at which the machine fails to operate or cause damage to other components. A relatively inexpensive and simple repair if made early in the fault progression can prevent more serious and expensive subsequent repairs.

Therefore, it is desirable to detect and locate malfunctioning components as early as possible. Furthermore, it is desirable to detect such faults without interfering with normal machine operation. Taking a machine out of service to perform diagnostic operations may be undesirable and inefficient. Furthermore, the onset of many defects often is not apparent without extensively dismantling the machine.

It is known that many defects in a rotating machine generate periodic vibrations that are discernibly different from vibrations produced when that machine is properly operating. Most vibration based diagnostic work has been done by experienced engineers based on their empirical knowledge. However, it is desirable to enable less experienced technicians to service machinery. Therefore it is further desirable to provide equipment which analyze the vibrations and provide indications of the occurrence of a fault and the component that is failing.

Heretofore, equipment that automatically diagnoses faults had to be developed for a particular rotating machine. Many characteristics of a machine's design contribute to vibrations which occur during normal operation and the manner in which the vibrations change during various fault conditions. This required that a separate computer program be written to analyze the vibration signals for a specific machine configuration. Thus if a particular machine configuration is not in a repertoire of analysis programs, new analysis software must be developed. Because new types of rotating machines are constantly being developed, it is impractical to develop analysis software for every machine using conventional techniques.

As a consequence, if the design of the machine changed or components were replaced with ones that were not the same as the original components, the vibration patterns during fault-free and fault operation could change. For example, the vibration pattern of the entire machine might change significantly if a repair is made using a different type of motor. In that case, the equipment that analyzed vibrations to detect faults also had to be modified which could require extensive engineering analysis and software development. Such modification of the fault diagnostic equipment is not economically justified unless a relatively large number of machines are altered in the same manner.

SUMMARY OF THE INVENTION

Faults occurring in a rotating machine are diagnosed by a method which configures a diagnostic apparatus by storing a definition of the particular rotating machine. That definition specifies components and their functional characteristics. In the preferred embodiment of the method, the rotating machine is defined by storing a table of components and modifying that table with data specifying operational characteristics of each component. In that embodiment, the definition of the rotating machine also may incorporate site specific features that are unique to the particular installation of the machine. The configuration of the rotating machine further includes identification of sensors which provide operational data related to the rotating machine's performance. For example, such operation data may be related to machine vibration, oil contamination, or refrigerant analysis.

The diagnostic procedure is defined by storing specification of portions of the operational data from the sensors which are to be selected for analysis. Analytical rules are provided which specify formulae by which machine faults are deduced from the portions of the operational data. For example, the analytical rules may be stated as signature rules and problem rules. The signature rules define formulae by which machine performance characteristics are deduced from the portions of the operational data. The problem rules define formulae by which machine faults are deduced from the machine signatures. Both types of rules may utilize the site specific definition of the rotating machine to customize the analysis to that particular machine.

The analysis of the rotating machine's operation is performed by acquiring actual operational data from the plurality of sensors. The specifications are employed to extract portions of the actual operational data which are to be operated on by the rules to detect faults in the rotating machine. In response to this process an indication is generated when a fault is detected. In the preferred embodiment, salient observations about the machine operation are extracted from the operational data. These observations include, for example, peak amplitudes and their corresponding frequencies from a set of vibration measurements. Signature rules then are applied to the salient observations to deduce the signatures of the machine. Such signatures may include harmonics that are present for the machine. Then problem rules are applied to the signatures to deduce when faults occur.

The present method enables the analytical process to be configured to different type of rotating machines and reconfigured when functional characteristics of a given machine change, such as upon replacement of a component.

BRIEF DESCRIPTION OF THE DRAWINGS

FIG. 1 is a schematic representation of a motor driven compressor on which the present invention is incorporated;

FIG. 2 is an end view of the motor in FIG. 1;

FIG. 3 is a block schematic diagram of the circuitry for diagnosing problems in the motor and compressor.

DETAILED DESCRIPTION OF THE INVENTION

Figure 4:
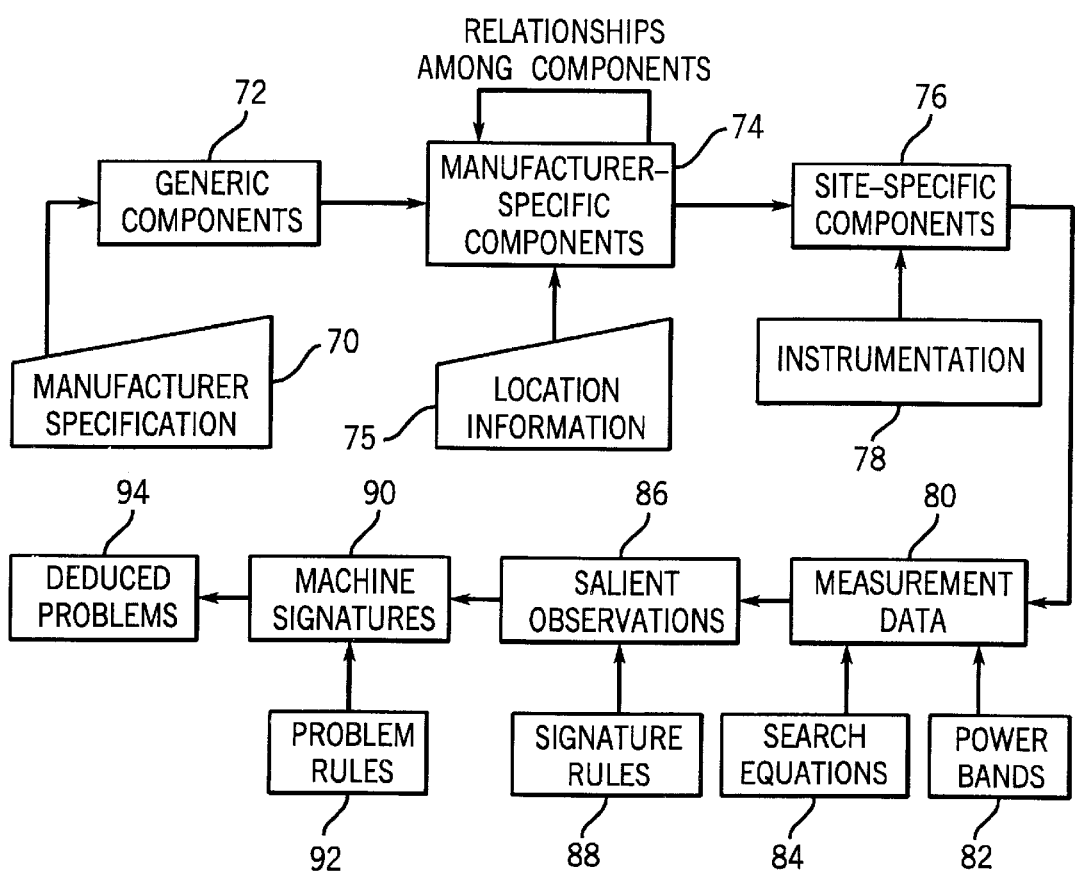
FIG. 4 is a flow chart of the fault detection process performed by the circuit in FIG. 3.

With initial reference to FIG. 1, an exemplary rotating machine 10 has a compressor 14 of the type that is commonly found in HVAC systems and is driven by motor 12. The motor 12 comprises stator coils 16 surrounding a shaft 18. The motor shaft 18 is supported within the housing 20 of the motor by a first bearing 22 at the off-end of the motor 12 and by a second bearing 24 at the drive-end of the motor. The motor shaft 18 is connected to an input shaft 26 of the compressor 14 by a standard coupling 28.

The input shaft 26 has a first gear 30 mounted thereon so as to rotate with that shaft. A drive shaft 32 of the compressor 14 is connected to a second gear 34 which meshes with the first gear 30. The drive shaft 32 also is coupled to a compressor impeller 36 which produces a flow of refrigerant at a relatively high pressure.

The housing 20 of the motor 12 is shown connected directly to the housing 38 for the compressor 14, but in other installations, the housings may be detached from one another. Both the motor and the compressor are in turn attached to a structural element 40 of the building with which they are used. For example, the housings 20 and 38 may be bolted to either a concrete pad on the ground or to a platform on the building roof. Other mounting techniques incorporate vibration isolation devices between the respective housing 20 and 38, and the support member for the rotating machine 10. As will be described, the resiliency, or lack of resiliency of the mounting mechanism affects the amount of vibration in the rotating machine 10.

Nine vibration sensors 41–49, such as accelerometers, are mounted to the structure of the motor 12 and compressor 14. With respect to the motor 12, three vibration sensors 41, 42 and 43 are fixedly attached to the motor housing 20 at the off-end on three orthogonal axes, as also shown in FIGS. 1 and 2. Specifically, the first vibration sensor 41 is mounted to the top surface of the motor housing 20 so as to sense vibrations in a vertical direction, and the second vibration sensor 42 is attached to the side of the motor housing 20 to sense vibrations along a horizontal axis passing through the motor shaft 18. The third vibration sensor 43 is mounted to the end surface of the motor housing 20 in an orientation to sense vibrations occurring along the longitudinal axis of the motor shaft 18. A similar trio of vibration sensors 44, 45 and 46 are mounted at the drive-end of the motor housing 20. The fourth, fifth and sixth sensors 44, 45 and 46 sense vibrations at that end of the motor in the vertical, horizontal and longitudinal axes, respectively. Another set of three vibration sensors 47, 48 and 49 are attached to the housing 38 of the compressor 14. Specifically, the seventh vibration sensor 47 is attached to sense vibrations in the vertical direction, the eighth vibration sensor 48 produces a signal indicating vibrations in the horizontal direction, and the ninth vibration sensor 49 detects vibrations occurring in a direction parallel to the longitudinal axis of the input and drive shafts 28 and 32.

With reference to FIG. 3, the first through ninth vibration sensors 41–49 on the rotating machine 10 are connected to data logging equipment 50 in the building 52 in which the rotating machine is located. The data logging equipment 50 digitizes the sensor signals and stores the resultant data samples in an organized manner along with data from other rotating machines in the building. Periodically, such as once a day, the stored data samples are transferred to a diagnostic computer 54 in a data analysis center 56. For example the data analysis center 56 may be a common facility that processes data from buildings throughout a country and provides reports regarding the machine operation to the owners of the individual buildings. Alternatively, the data samples may be transferred into a portable computer 58 that is taken to the building 52 by a service technician. The diagnostic computers 54 and 58 execute software that analyzes the sensor data and presents a report indicating the operational health of the rotating machine 10 and the other machines in the building 52.

The diagnostic computers 54 and 58 can be configured to automatically and systematically diagnose a wide variety of rotating machines with different physical and operational characteristics. This is accomplished by allowing the user to dynamically characterize major components of each machine, construct search equations that extract salient observations from the machine measurements, specify signature rules that deduce machine performance characteristics from the salient observations, and finally define problem rules that identify faults in the rotating machine. The flexibility of this apparatus provides the user with the capability to describe classes of rotating machines (e.g. different configurations of machines from different manufacturers) and combine those descriptions with actual measurements in a systematic and logical way to draw conclusions regarding the health of the specific operating machine under investigation.

Referring to FIG. 4, the fault diagnostic procedure is broadly partitioned into the set-up phase and the analysis phase. In the set-up phase the diagnostic computer is configured for the particular installation of a rotating machine by specifying the type of machine and environmental parameters. The machine definition and configuration are subdivided to generic components, manufacturer's specific characteristics and instance parameters. In block 72 of the set-up phase, the generic components of the machine are specified and then defined further utilizing the manufacturer specifications of the particular components used in the rotating machine 10. For example, the rotating machine 10 has the generic components of an electric motor 12 and a compressor 14. The manufacturer's specification for the motor define a certain number of poles and that it is to be powered by electricity having a given frequency. The particular compressor 14 has two shafts 26 and 32 connected by gears 30 and 34 which have a particular gear ratio.

The user setting up the diagnostic computer defines the rotating machine 10 in terms of its generic components and the manufacturer specifications for those components. This can be accomplished by the microcomputer displaying a menu of selection choices on the control panel and allowing the user to select from that menu and, as necessary, enter other types of data regarding the manufacturer's specification. These and other input data is stored in tables in the diagnostic computer 54.

From these characteristics, the diagnostic computer 54 is able to derive the speed at which the motor 12 and shafts 26 and 32 rotate. The specification of the number of poles of the motor and the frequency of the electric current supplying the motor is used by the diagnostic computer to calculate the speed at which the shaft of the motor 12 and the input shaft 26 rotate. The motor speed and the ratio of gears 30 and 34 then are used to calculate the expected speed of the compressor drive shaft 32.

This machine definition is further modified at process block 74 by location specific information in block 75 that the user supplied. This location specific information is particular to the particular installation of this machine. For example, the type of mount that is used to secure the rotating machine 10 to the supporting structural element 40 of the building is an example of location specific information. Mounts having different resiliency affect the vibrations induced in the rotating machine, and thus the measurements that are analyzed by the diagnostic computer 54. When the location specific information is merged with the manufacturer specific components at block 74, the resulting information forms a construct of site specific components for the rotating machine at block 76. Thus the generic components have been transformed into a manufacturer specific component, which in turn has been transformed into a site specific definition of the rotating machine installed in a particular building.

Process block 78 contains information that the user entered which defines the instrumentation attached to the rotating machine 10. With respect to the motor 12, the user has specified a location and orientation of each of the vibration sensors 41–46 attached to the motor housing 20. Similar specification for the vibration sensors 47–49 attached to the compressor 12 also is provided in block 78.

Thereafter, if a component is replaced, the set-up phase can be run again to specify the replacement component. This revision then is passed through the set-up phase process resulting in a new site-specific component description at block 76 which is used thereafter by the diagnostic computer 54.

With continuing reference to FIG. 4, after completion of block 76, the diagnostic process is ready for the analysis phase which comprises procedure blocks 80–94, and is performed repetitively by the diagnostic computer 54 during the operation of the rotating machine 10 or off-line after all of the measurement data for a given time period has been collected. The analysis uses information from the set-up phase and expertise of a trouble shooting knowledge base. The system is unique in that the measurement data is decoupled from the rules contained in the knowledge base.

At the initial block 80 of the analysis phase, the measurement data is acquired and processed to extract important features, referred to as salient observations. In the first step with respect to the exemplary rotating machine 10, the vibration signals from the nine sensors 41–49 are individually processed by a fast Fourier transform (FFT) to convert the time domain signals from the sensors into the frequency domain. To obtain the salient observations from the resultant frequency spectra, search equations are employed that define frequency bands in which salient observations fall. The frequency search bands, which can be specified either as absolute low and high frequency limits or as a center frequency with delta frequencies relative to the center frequency, are specified as search equations defined by analysis. These search equations can have terms that depend upon machine specifications, computed values derived from the set-up phase, or even on previously found salient observations. Heuristics are also incorporated to obtain estimated values, when the salient observations on which search equation is dependent are unavailable. These search equations are stored in a table within the diagnostic computer as represented by block 84 on FIG. 4.

In the exemplary rotating machine 10 which has three rotating shafts 18, 26 and 32, the user specifies two search equations which define frequency bands associated with each of those rotational speeds. The frequencies bands are derived from the speed of the motor 12. The first frequency band for vibrations of the motor 12 and the input shaft 26 is bounded at the upper limit by the nominal operating speed of the motor, and at the lower limit by a predetermined fraction of the nominal operating speed. For example, the upper limit of the frequency band for the motor vibration may be defined by the equation:

$$(2*\text{LINE FREQUENCY}-)/\text{POLES} \tag{1}$$

where LINE FREQUENCY is the frequency of the alternating current that powers the motor and POLES is the number of poles in the motor. These values are contained in the site specific component data produced at process block 76. The lower limit of the frequency band for the motor vibration may be defined by the equation:

$$(2*\text{LINE FREQUENCY}-6)/\text{POLES} \tag{2}$$

A second frequency band is defined by another search equation which is derived by calculating the nominal speed of the drive shaft 32 based on the actual running speed of the compressor input shaft 26 and the ratio of gears 30 and 34. This nominal drive shaft speed defines the upper limit of the frequency band. The lower limit is set as a predetermined amount less than that nominal frequency, in much the same way as the lower limit of the motor was determined.

The microcomputer 54 inspects the frequency data from each sensor 41–49 that falls within the defined bands to find the data peak within those bands. The peak search is performed by examining all available data measurements and choosing the one that has the best resolution and applying a moving three point quadratic fit to the data to obtain all significant peak amplitudes.

A power band calculation also can be applied to the frequency spectra data. A power band is a conventional function that computes the power content between two frequency limits. The limits for the power bands are defined by the user in a similar fashion as with respect to the search equations 84 and are stored within a separate table in the diagnostic computer 54 that is represented by block 82. The power band computation is done by searching the measurement data that has the best resolution, and then computing the total power over the specified frequency limit. The result of the operations performed at block 80 are a table of salient observations which is used by the next processing block 86.

The next step of the analysis process is to extract meaningful signatures denoting the existence of conditions of interest that are each exhibited by the machine under study. To do this, each salient observation is transformed into a separate qualitative measure, such as negligible, low, medium and high categories. For each possible salient observation, the user has defined the boundaries of the qualitative categories in terms of values for that specific salient observation. Therefore, when a given salient observation is supplied to block 86, its value is compared to the qualitative limits and a designation of the respective qualitative measurement is stored in the diagnostic computer 54. Thus, a given salient observation can be categorized as presently having negligible, low, moderate or high significance or any category that the user deems necessary. This qualitative measurement is the first step of determining meaningful signatures within the salient observations.

Next, signature rules are applied to the qualitative measures. The signature rules are if-then statements having specific conditions which when satisfied indicate the presence of that signature. The conditional, or if, part of the statement may be quite complex, involving a plurality of terms related by mathematical, logical, or relational operators. The terms involved in the signature rules can be the transformed salient observations, constants or raw salient observation data. For example, a signature rule that specifies the severity of the harmonic frequencies of the motor shaft is given by the expression:

$$(2\times\text{MS}+3\times\text{MS}+4\times\text{MS}) \geq (1\times\text{MS:LOW}/6) \text{ AND } (2\times\text{MS}+3\times\text{MS}+4\times\text{MS}) < (1\times\text{MS:LOW})$$

where 2×MS, 3×MS, and 4×MS are amplitude values of the frequency domain data at the second, third and fourth harmonics of the motor speed (MS) and 1×MS:LOW is the threshold of the low qualitative category for the fundamental frequency of the motor speed.

When a signature rule is invoked, the microcomputer automatically orders its terms in the if part of the rule, retrieves the necessary data, performs the if test, and applies the rule. A true or false result is returned depending upon whether or not the if condition is met, When the if condition is met, then the signature of the machine is present.

The results of applying signature rules to the salient observations is passed to block 90 as machine signatures. The final step in the diagnostic process is to deduce potential problems for the machine under study. The method adopted for this stage of the process is similar to the signature rule processing. Specifically, problem rules are defined by the user and stored in the diagnostic computer 54 as denoted block 92. The problem rules are also if-then statements in which the condition, i.e. the if part of the rule, looks for certain combination of machine signatures and possibly actual measurement data to determine whether a problem is present. If the returned value is true, a problem is deduced to be present on the machine being examined and the appropriate notification is provided at block 94.

For example the following problem rule indicates a dangerous degree of motor shaft imbalance:

MS FUNDAMENTAL:HIGH @ ANY(mov, moh, mdv, mdh) AND
MS HARMONIC:NEG @ ALL(mov, moh, moa, mdv, mdh, mda)

where MS FUNDAMENTAL:HIGH designates the high qualitative category of data for the motor shaft fundamental frequency, the terms mov, moh, moa respectively specify the vertical, horizontal and axial off-end motor sensors, the terms mdv, mdh, mda specify the same sensors at the drive end of the motor, and MS HARMONIC:NEG designates the negligible qualitative category of data for the harmonics of the motor shaft. In this case a dangerous motor shaft imbalance exists if any one of the horizontal or vertical motor sensors has a high signal component at the fundamental motor speed while all the harmonics of the fundamental motor speed are negligible.

When a problem condition exists, an alarm of warning is emitted by the diagnostic computer 54 at block 94. The warning is displayed on the computer's control panel and can be sent electronically to the building to alert staff at the facility.

What is claimed is:

1. A method for dynamically configuring a diagnostic apparatus for automatically and systematically diagnosing faults in a rotating machine, comprising:
    creating definitions for all major components of the rotating machine and storing the definitions in a memory of the apparatus;
    constructing search equations for extracting salient observations from machine measurements acquired from the rotating machine and storing the search equations in the memory; and
    specifying rules for deducing machine signatures from the salient observations and identifying faults in the rotating machine from the machine signatures, and storing the rules in the memory.

2. The method of claim 1, wherein creating definitions of major components comprises specifying generic components for the rotating machine and transforming the generic components into manufacturer specific components.

3. The method of claim 2, wherein specifying generic components includes selecting the generic components from a menu of selection choices.

4. The method of claim 2, wherein transforming the generic components includes adding manufacturer specifications to the generic components.

5. The method of claim 2, wherein creating definitions of major components further comprises transforming the manufacturer specific components into site specific definitions of the components.

6. The method of claim 5, wherein transforming the manufacturer specific components comprises adding location specific information to the manufacturer specific components.

7. The method of claim 1, further including creating definitions of instrumentation attached to the rotating machine and storing the instrumentation definitions in the memory.

8. The method of claim 1, wherein the machine measurements comprise vibration data acquired from the rotating machine and the search equations define frequency bands for the vibration data in which the salient observations fall.

9. The method of claim 8, wherein the frequency bands are specified as absolute low and high frequency limits or as a center frequency with delta frequencies relative to the center frequency.

10. The method of claim 8, wherein at least one of the major components definitions, search equations, and rules are stored within a table contained in the memory.

11. The method of claim 8, wherein the rules for deducing machine signatures include signature rules comprising "if"-"then" statements having specific conditions which when satisfied indicate the presence of that signature.

12. The method of claim 11, wherein the "if" part of each statement involves a plurality of terms related by mathematical, logical or relational operators.

13. The method of claim 12, wherein the terms include at least one of transformed salient observations, constants and raw salient observations.

14. The method of claim 12, wherein the apparatus is a computer.

15. The method of claim 8, wherein the rules for identifying faults in the rotating machine include problem rules comprising "if"-"then" statements that test for combinations of machine signatures.

16. The method of claim 15, wherein the "if" part of at least one statement further tests for actual measurement data.

17. A method for automatically and systematically diagnosing faults in a rotating machine using a diagnostic apparatus, comprising:
    performing a set-up phase for the apparatus, the set-up phase including:
        constructing definitions of major components of the rotating machine,
        constructing search equations for extracting salient observations from machine measurements, and
        specifying rules for deducing machine signatures from the salient observations and identifying faults in the rotating machine from the machine signatures; and
    performing an analysis phase with the apparatus, the analysis phase including:
        acquiring machine measurements using a plurality of sensors mounted on the rotating machine and sup plying the machine measurements to the apparatus, extracting salient observations from the machine measurements using the search equations, deducing machine signatures from the salient observations using the signature rules, and identifying faults in the rotating machine using the rules.

18. The method of claim 17, wherein the machine measurements comprise vibration data acquired from the machine and the search equations define frequency bands for the vibration data in which the salient observations fall, the extracting step comprising obtaining data peaks within the frequency bands.

19. The method of claim 18, wherein the data peaks are extracted from the data by quadratic fit.

20. The method of claim 18, further comprising applying a power band calculation to the vibration data.

21. The method of claim 18, further comprising categorizing the salient observations according to their significance.

22. The method of claim 18, further comprising repeating the set-up phase whenever a change is made to the rotating machine.

* * * * *